United States Patent
Takizawa

(10) Patent No.: US 7,786,550 B2
(45) Date of Patent: Aug. 31, 2010

(54) P-TYPE SEMICONDUCTOR AND SEMICONDUCTOR HETERO MATERIAL AND MANUFACTURING METHODS THEREOF

(75) Inventor: Toshiyuki Takizawa, Osaka (JP)

(73) Assignee: Panasonic Corporation, Osaka (JP)

( * ) Notice: Subject to any disclaimer, the term of this patent is extended or adjusted under 35 U.S.C. 154(b) by 1901 days.

(21) Appl. No.: 10/790,864

(22) Filed: Mar. 3, 2004

(65) Prior Publication Data

US 2004/0173788 A1 Sep. 9, 2004

(30) Foreign Application Priority Data

Mar. 6, 2003 (JP) ............... 2003-059520
Aug. 29, 2003 (JP) ............... 2003-306459

(51) Int. Cl.
*H01L 29/12* (2006.01)
(52) U.S. Cl. ............... 257/611; 257/E29.068
(58) Field of Classification Search ............... 257/183, 257/201, 607–617, E29.068–E29.104
See application file for complete search history.

(56) References Cited

U.S. PATENT DOCUMENTS

| 3,664,866 | A | * | 5/1972 | Manasevit | ............... | 428/700 |
| 4,901,330 | A | * | 2/1990 | Wolfram et al. | ............... | 372/75 |
| 5,076,860 | A | | 12/1991 | Ohba et al. | | |
| 5,825,052 | A | * | 10/1998 | Shakuda | ............... | 257/94 |
| 6,021,173 | A | * | 2/2000 | Brauers et al. | ............... | 378/98.8 |
| 6,407,405 | B1 | | 6/2002 | Sano et al. | | |
| 6,815,728 | B2 | | 11/2004 | Tsuda et al. | | |
| 2002/0034861 | A1 | | 3/2002 | Iwata et al. | | |
| 2002/0053665 | A1 | * | 5/2002 | Tsuda et al. | ............... | 257/14 |
| 2003/0001168 | A1 | | 1/2003 | Tsuda et al. | | |
| 2004/0029368 | A1 | * | 2/2004 | Harmon et al. | ............... | 438/510 |

FOREIGN PATENT DOCUMENTS

| JP | 2-275682 | | 11/1990 |
| JP | 05-243614 | | 9/1993 |
| JP | 05-243614 A1 | * | 9/1993 |
| JP | 7-249820 | | 9/1995 |
| JP | 08-056054 | | 2/1996 |
| JP | 2000-031537 | | 1/2000 |

(Continued)

OTHER PUBLICATIONS

K. Kumakura et al., "Activation Energy and Electrical Activity of Mg in Mg-Doped $In_xGa_{1-x}N(x<0.2)$", Japanese Journal of Applied Physics, Apr. 5, 2000, vol. 39, part 2, No. 4B, pp. L337-L339.

*Primary Examiner*—Sue Purvis
*Assistant Examiner*—Kevin Quinto
(74) *Attorney, Agent, or Firm*—Wenderoth, Lind & Ponack, L.L.P.

(57) ABSTRACT

A p-type semiconductor includes a host material that is a semiconductor, an acceptor element and a localized band formation element. The acceptor element is doped to the host material and has fewer valence electrons than valance electrons of at least one of the elements which compose the host material. The localized band formation element is doped to the host material, is isovalent with at least one of the elements which compose the host material, has smaller electronegativity than the electronegativity of the element(s), and forms the localized band which activates holes of an acceptor level.

6 Claims, 14 Drawing Sheets

FOREIGN PATENT DOCUMENTS

| | | | |
|---|---|---|---|
| JP | 2000-332296 | * | 11/2000 |
| JP | 2002-50229 | | 2/2002 |
| JP | 2002-93821 | | 3/2002 |
| JP | 2002-118328 | | 4/2002 |
| JP | 2002-270969 | | 9/2002 |
| JP | 2002-289918 | | 10/2002 |
| JP | 2002-314205 | | 10/2002 |
| JP | 2002-353144 | | 12/2002 |

* cited by examiner

Localized band layer 710a
Acceptor layer 700a

Acceptor region 700b

Localized band region 710b

P-TYPE SEMICONDUCTOR AND SEMICONDUCTOR HETERO MATERIAL AND MANUFACTURING METHODS THEREOF

BACKGROUND OF THE INVENTION (1) Field of the Invention

The present invention relates to a p-type semiconductor and particularly to a p-type semiconductor with low resistance.

(2) Description of the Related Art

In recent years, a nitride semiconductor based on gallium nitride has been commercially utilized for a full color display, a blue (long wave ranged from ultraviolet to yellow) light-emitting diode used for a signal light and the like, a write/read apparatus for optical recording media and blue laser used for a laser microscope and the like. Further, the nitride semiconductor is expected to be applied to media which enables high-density record and white light source which uses no mercury. Additionally, since an oxide semiconductor based on zinc oxide has a band gap of 3.37 eV at room temperature, resistance to reducing gas, stability at a high temperature, and excellent transparence, it is expected to be applied to a transparent conductive film and like besides the above-mentioned media which enables high-density record, although it is not yet commercially utilized.

There are some problems to realize and spread these technologies. The biggest problem is to realize a p-type semiconductor with low resistance. To lower the resistance of a p-type semiconductor, it is necessary to increase hole carriers in a valence band which contribute to conduct electricity. To increase the hole carriers in the valence band, it is general practice to dope an acceptor dopant. However, an acceptor level of a nitride semiconductor used to realize these technologies is formed at a deep level in a forbidden band since electronegativity of nitrogen included in nitride semiconductor is large. Therefore, it is impossible to obtain a p-type nitride semiconductor with high concentration of hole carriers even though an acceptor dopant is doped. For example, gallium nitride doped with magnesium as an acceptor dopant has activation energy of about 200 meV. Even gallium nitride doped with beryllium, which has the least activation energy, as an acceptor dopant, has activation energy of about 85 meV. The activation energy is extremely high compared with thermal energy of about 26 meV at room temperature and therefore it is impossible to obtain a p-type gallium nitride semiconductor with high concentration of hole carriers. Additionally, an acceptor level of an oxide semiconductor is similarly formed at a deep level in a forbidden band since electronegativity of oxygen included in an oxide semiconductor is large. Therefore, it is impossible to obtain a p-type oxide semiconductor with high concentration of hole carriers even though an acceptor dopant is doped. For example, zinc oxide doped with nitrogen as an acceptor dopant has activation energy of about 200 meV. The activation energy is extremely high compared with thermal energy of about 26 meV at room temperature and therefore it is impossible to obtain a p-type zinc oxide semiconductor with high concentration of hole carriers.

As the background art to solve these problems, there are "Manufacturing method of a p-type semiconductor crystal and a light-emitting device" (refer to Japanese Laid-Open Patent application No. 14-289918), "Transparent conductive film of zinc oxide" (refer to Japanese Laid-Open Patent application No. 14-50229), "p-type Group III nitride semiconductor and manufacturing method and semiconductor device thereof" (refer to Japanese Laid-Open Patent application No. 14-353144), and "Growth method of p-type ZnO oxide semiconductor layer and manufacturing method of semiconductor light-emitting element using the method" (refer to Japanese Laid-Open Patent No. 14-93821). These methods, which relate to methods for lowering resistance of a p-type semiconductor, make an acceptor level shallow and lower resistance of a p-type semiconductor by doping an acceptor dopant and a donor dopant at the same time, and forming a composite which is made of an acceptor dopant and a donor dopant in host material.

However, there is a problem that a p-type semiconductor with satisfactorily low resistance cannot be obtained by conventional methods for lowering resistance of a p-type semiconductor. For example, according to a recent experiment report of Professor Yoshida et al. of Osaka University, gallium nitride doped with magnesium as an acceptor dopant and with oxygen as a donor dopant at a rate of 2 to 1 has activation energy of about 50 meV. The activation energy is extremely high compared with thermal energy of about 26 meV at room temperature and therefore it is impossible to obtain a p-type gallium nitride semiconductor with satisfactorily low resistance.

SUMMARY OF THE INVENTION

In view of the foregoing problem, it is the object of the present invention to realize a p-type semiconductor with low resistance.

To achieve the above-mentioned object, the p-type semiconductor according to the present invention is a p-type semiconductor comprising a localized band formation element which is isovalent with at least one of elements which compose the semiconductor and has smaller electronegativity than electronegativity of the element. Here, it is acceptable that the p-type semiconductor further comprises an acceptor element which has fewer valence electrons than valence electrons of at least one of the elements which compose the semiconductor.

Hereby, since an energy band filled with electrons is formed near to an acceptor level, an effect to activate many holes and lower the resistance of the p-type semiconductor is achieved.

Additionally, it is acceptable that amount of the localized band formation element is larger than amount of the acceptor element.

Hereby, since it is possible to widen the width of the energy band formed near to the acceptor level, an effect to conduct electricity with low resistance is achieved.

Moreover, it is acceptable that the acceptor element has a lower energy level than a top of an energy band which the localized band formation element has.

Hereby, since it is possible to activate all the holes, an effect to further lower resistance of the p-type semiconductor is achieved.

Additionally, it is acceptable that the acceptor element and the localized band formation element are distributed uniformly.

Hereby, since an energy band formed near to the acceptor level is isotropically formed, an effect to conduct electricity efficiently is achieved.

Moreover, it is acceptable that amount of the localized band formation element is 2 atom % or less.

Hereby, since it is possible to make the width of the energy band formed near to the acceptor level appropriate, an effect to maintain the band gap of the semiconductor to which the localized band formation element is not doped and to conduct electricity with low resistance is achieved.

Additionally, it is acceptable that the compound semiconductor is a nitride semiconductor.

Hereby, since it is possible to activate many holes in a nitride semiconductor which has a deep acceptor level because electronegativity of nitrogen large, an effect to lower the resistance of a p-type nitride semiconductor is achieved.

Moreover, it is acceptable that the compound semiconductor is an oxide semiconductor.

Hereby, since it is possible to activate many holes in an oxide semiconductor which has a deep acceptor level because electronegativity of oxygen is large, an effect to lower the resistance of a p-type oxide semiconductor is achieved.

Additionally, it is acceptable that a part including the acceptor element and a part including the localized band formation element are separated spatially.

Hereby, since the part generating holes and the part transmitting holes are separated and diffusion of holes are restraint, an effect to further lower the resistance of the p-type semiconductor is achieved.

Moreover, it is acceptable that the part including the acceptor element and the part including the localized band formation element are different semiconductors.

Hereby, since what the two semiconductors are combined as is the p-type semiconductor and different semiconductors are applied to each of the two semiconductors, an effect to raise design flexibility of the p-type semiconductor drastically is achieved.

Additionally, it is acceptable that the p-type semiconductor is a nitride semiconductor which has a crystal defect caused by missing of a Group III element, and the localized band formation element is at least one of phosphorus, arsenic and antimony.

Hereby, since there is no need to dope the acceptor element, an effect to realize the p-type semiconductor with low resistance easily is achieved.

Moreover, it is acceptable that a semiconductor device has a layered structure that composes semiconductor layers which include a p-type semiconductor layer.

Hereby, since it is possible to apply the p-type semiconductor with low resistance as a semiconductor device, an effect to realize a semiconductor device with low power consumption is achieved.

Additionally, it is acceptable that the p-type semiconductor contacts an electrode with a junction.

Hereby, since the electrode is contacted to the p-type semiconductor with a high concentration of carrier, an effect to lower the contact resistance with the electrode is achieved.

Moreover, it is acceptable that the semiconductor device is a light-emitting semiconductor device.

Hereby, since it is possible to apply the p-type semiconductor with low resistance to a light-emitting semiconductor device, an effect to realize a light-emitting semiconductor device with high light-emitting efficiency is achieved.

Additionally, it is acceptable that the present invention is a hetero-junction semiconductor material comprising: a p-type semiconductor layer; and a target material layer which contacts the p-type semiconductor layer with a junction and where holes are implanted from the p-type semiconductor layer, wherein the p-type semiconductor layer includes: an acceptor element which has fewer valence electrons than at least one of elements which compose the p-type semiconductor layer, and a localized band formation element which is isovalent with at least one of elements which compose the p-type semiconductor layer and has smaller electronegativity than electronegativity of the element, and the target material layer includes one constituent element which has smaller electron affinity than electron affinity of at least one of elements which compose the p-type semiconductor layer.

Here, it is acceptable that the localized band formation element has an energy band at a same or lower energy level than energy at a top of a valence band of the target material layer. Additionally, it is acceptable that the target material layer further includes the acceptor element and that the p-type semiconductor layer has a smaller lattice constant than a lattice constant of the target material layer and a tensile distortion at a junction part between the p-type semiconductor layer and the target material layer. Moreover, it is acceptable that the hetero-junction semiconductor material further comprises an intermediate layer where compositions of the p-type semiconductor layer and the target material layer mix between the p-type semiconductor and the target material layer.

Additionally, it is acceptable that the target material layer is an aluminum indium gallium nitrogen layer; the amount of indium is 0~100%, the amount of aluminum is 0~100% and that the p-type semiconductor layer is a nitride semiconductor layer. Moreover, it is acceptable that the p-type semiconductor layer is an oxide semiconductor layer and that the p-type semiconductor layer is a fluoride layer. Additionally, it is acceptable that the target material layer is a gallium nitride layer and the p-type semiconductor layer is a boron aluminum gallium nitrogen layer; the amount of boron is 0~100% and amount of gallium is 0~100%. Moreover, it is acceptable that the p-type semiconductor layer is an aluminum nitride layer and the localized band formation element is phosphorus or arsenic.

Hereby, since the localized band is formed near the acceptor level and at the same or lower energy level than the top of the valence band of the target material layer, an effect to realize the hetero-junction semiconductor material which improves the activation efficiency of holes and reduces the electric resistance component appearing the current/voltage characteristic of the hetero-junction semiconductor material is achieved.

Additionally, it is acceptable that the p-type semiconductor layer has a different crystal structure from a crystal structure of the target material layer. Here, it is acceptable that the p-type semiconductor has an amorphous structure or a polycrystalline structure.

Hereby, since it is possible to select the material of p-type semiconductor layer and the target material layer with high flexibility, an effect to realize the hetero-junction semiconductor material with high design flexibility is achieved.

Moreover, it is acceptable that in a junction part between the p-type semiconductor layer and the target material layer, one or both of plane directions of both layers and a direction of atomic arrangements in a plane are different.

Hereby, since it is possible to manufacture the hetero-junction semiconductor material not only by the crystal growth method but by, for example, the wafer fusion method, an effect to realize the hetero-junction semiconductor material to choose the manufacturing methods with high flexibility is achieved.

Additionally, it is acceptable that the target material layer is an n-type semiconductor layer with a high concentration.

Hereby, since it is possible to realize a unipolar device using the tunneling effect, an effect to realize the hetero-junction semiconductor material without the process of forming an electrode on the p-type semiconductor layer is achieved.

Moreover, it is acceptable that the p-type semiconductor is a buffer layer.

Hereby, since it is possible to manufacture the hetero-junction semiconductor material using the p-type semiconductor layer as a buffer layer, an effect to realize the hetero-junction semiconductor material which simplifies manufacturing process of the hetero-junction semiconductor material is achieved.

Additionally, it is acceptable that the present invention is a semiconductor device having hetero-junction semiconductor material according to the present invention.

Hereby, since the semiconductor device has the hetero-junction semiconductor material which has high activation efficiency of holes and reduces an electric resistance component appearing the current/voltage characteristic, an effect to realize the semiconductor device which enables low power consumption is achieved.

Moreover, it is acceptable that the present invention is a method for manufacturing a hetero-junction semiconductor material which is formed on a semiconductor substrate and includes a p-type semiconductor layer and a target material layer which contacts the p-type semiconductor layer with a junction and where holes are implanted from the p-type semiconductor layer, the method to comprising: a semiconductor layer formation step of forming one or more semiconductor layers on the semiconductor substrate by a crystal growth method; a p-type semiconductor formation step of forming the p-type semiconductor layer on the semiconductor layer by the crystal growth method; and a target material layer forming step of forming the target material layer on the p-type semiconductor layer by the crystal growth method. Here, the p-type semiconductor layer, which the hetero-junction semiconductor material has, includes an acceptor element which has fewer valence electrons than at least one of elements which compose the p-type semiconductor layer and a localized band formation element which is isovalent with at least one of elements which compose the p-type semiconductor layer and has smaller electronegativity than the element, and the method for manufacturing the hetero-junction semiconductor material further comprising a doping step of doping the localized band formation element and the acceptor element only to a part (depth: up to 0.1 μm) of the p-type semiconductor layer which contacts with the target material layer by an ion implantation method or diffusion method.

Hereby, since the target material layer is formed after the p-type semiconductor layer has been formed, it is possible to form the target material layer regardless of the temperature of heating to form the p-type semiconductor layer. In other words, an effect to realize a manufacturing method for enabling the formation of the target material layer at low temperature is achieved.

By the way, it is needless to say that the present invention can be realized not only as the p-type semiconductor and the hetero-junction semiconductor material described above, but also as another p-type semiconductor and other hetero-junction semiconductor material which have combined technical characteristics described above.

As is apparent from the explanation above, by the p-type semiconductor according to the present invention, the acceptor level is formed near the localized band and all the holes in the acceptor level are activated and therefore an effect to realize the p-type semiconductor with low resistance is achieved. Additionally, by the p-type semiconductor according to the present invention, since the p-type semiconductor has low resistance in the semiconductor device having the semiconductor lamination structure including the p-type semiconductor, an effect to reduce the operation voltage of the semiconductor device and reduce the power consumption is achieved. Moreover, by the p-type semiconductor according to the present invention, since the p-type semiconductor has a high concentration of hole carriers in the semiconductor device having the semiconductor layered structure which composes semiconductor layer including the p-type semiconductor contacted to an electrode, an effect to reduce contact resistance between the p-type semiconductor and the electrode and lengthen the lifetime of the semiconductor device is achieved.

Consequently, by the present invention, since it is possible to provide the p-type semiconductor with low resistance and therefore it is possible to realize the media which enables high-density record, and white light source which uses no mercury and the like is expected to be commercially utilized, its practical value is extremely high.

Additionally, by the hetero-junction semiconductor material according to the present invention, since the localized band is formed near to the acceptor level and at the same or lower energy level than the top of the valence band of the target material, an effect to realize the hetero-junction semiconductor material which improves activation efficiency of holes and reduce the electric resistance component appearing the current/voltage characteristic is achieved.

Consequently, it is possible by the present invention to provide the hetero-junction semiconductor material which improves the activation efficiency of holes, reduces the electric resistance component appearing the current/voltage characteristic and prevents the decrease of reliability because of heat generation. Therefore, its practical value is extremely high.

As further information about technical background to this application, Japanese Patent Application No. 2003-059520 filed on Mar. 6, 2003 and Japanese Application No. 2003-306459 filed on Aug. 29, 2003 are incorporated herein by reference.

BRIEF DESCRIPTION OF THE DRAWINGS

These and other objects, advantages and features of the invention will become apparent from the following description thereof taken in conjunction with the accompanying drawings that illustrate specific embodiments of the invention. In the drawings.

DESCRIPTION OF THE PREFERRED EMBODIMENTS

The p-type semiconductor according to the embodiments of the present invention will be explained below with reference to figures.

The First Embodiment

Figure 1:
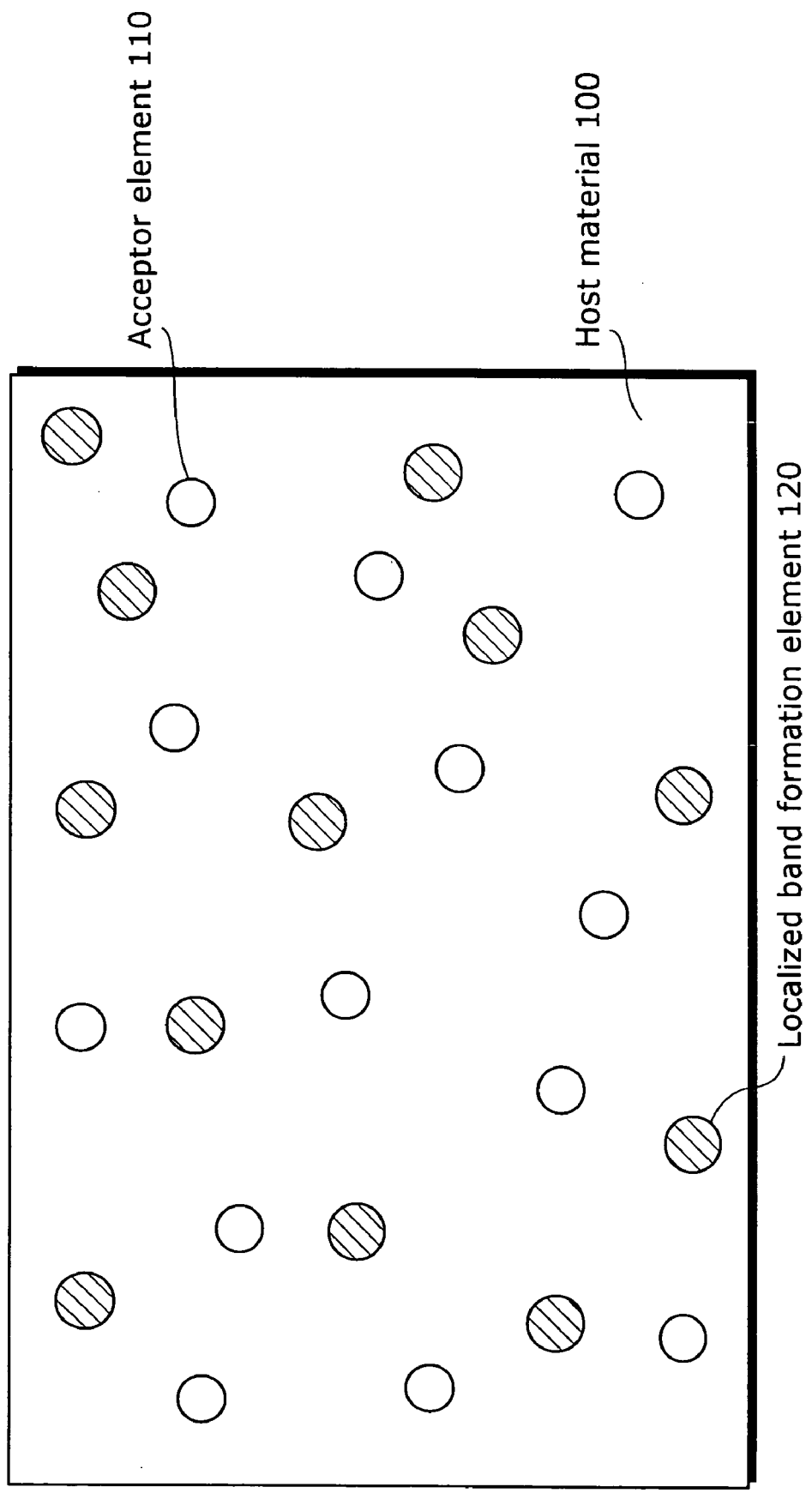
FIG. 1 is a diagram showing conceptually the structure of a p-type semiconductor according to the first embodiment of the present invention.

FIG. 1 is a diagram showing conceptually the structure of the p-type semiconductor according to the present embodiment.

The p-type semiconductor aims to realize a p-type semiconductor with low resistance and is composed of host material 100, an acceptor element 110 which is doped to the host material 100, and a localized band formation element 120 which is doped to the host material 100.

Here, the host material 100 is a simple semiconductor or a compound semiconductor. For example, a simple semiconductor is represented by a silicon semiconductor, a germanium semiconductor, and a diamond semiconductor; and a compound semiconductor is represented by a nitride semiconductor and an oxide semiconductor. By the way, a nitride semiconductor is a compound semiconductor including at least one of the Group III elements and at least one of the Group V elements including nitrogen; and an oxide semiconductor is a compound semiconductor including at least one of the Group II elements and at least one of the Group VI elements including oxygen.

Additionally, the acceptor element 110 is an element having fewer valence electrons than at least one of the elements which compose the host material 100. For example, when the host material 100 is a nitride semiconductor, the acceptor element 110 is at least one of carbon, silicon, germanium, tin, beryllium, magnesium, zinc, cadmium and calcium; and when the host material 100 is an oxide semiconductor, the acceptor element 110 is at least one of nitrogen, phosphorus, arsenic and antimony.

Next, the localized band formation element 120 is an element which is isovalent with at least one of the elements which compose the host material 100 and has smaller electronegativity than electronegativity of the element(s). For example, when the host to material 100 is a nitride semiconductor, the localized band formation element 120 is at least one of phosphorus, arsenic and antimony; and when the host material 100 is an oxide semiconductor, the localized band formation element 120 is at least one of sulfur, selenium and tellurium.

The p-type semiconductor having a structure like this is manufactured by (1) preparing a substrate such as sapphire, silicon, silicon carbide, gallium arsenide, zirconium boride, magnesium aluminum complex oxide, lithium gallium complex oxide and gallium nitride and (2) executing epitaxial growth, on the substrate, by Metal Organic Chemical Vapor Deposition method (hereinafter, referred to as MOCVD method), Molecular-Beam Epitaxy method (hereinafter, referred to as MBE method), hydride vapor deposition method and the like, in an appropriate chamber.

Figure 2:
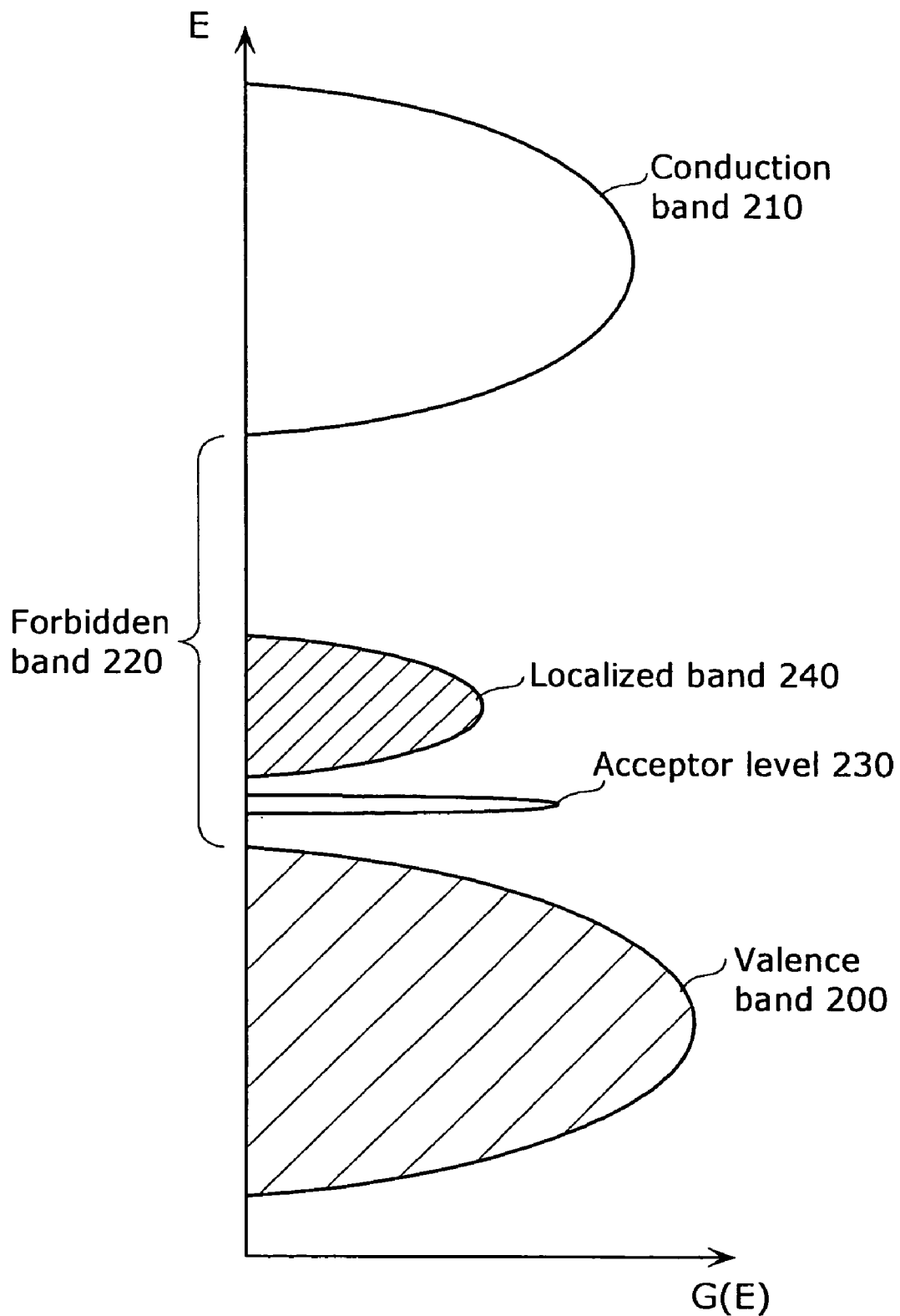
FIG. 2 is a diagram showing the energy structure of the p-type semiconductor according to the first embodiment.

FIG. 2 is a diagram showing the energy structure of the p-type semiconductor according to the present embodiment. The vertical axis represents energy and the horizontal axis represents state density.

In FIG. 2, an acceptor level 230 is formed near to a valence band 200 in a forbidden band 220; and a localized band 240 is formed near to the acceptor level 230. Here, the acceptor level 230 is formed by doping the acceptor element 110 to the host material 100. Additionally, the localized band 240 is filled with electrons and formed by doping the localized band formation element 120 to the host material 100. Since the localized band 240 is formed near to the acceptor level 230, the acceptor element 110 accepts electrons from the localized band 240 and leaves holes in the localized band 240. The present inventor supposes that the mechanism of forming the localized band 240 described above is as follows. Namely, the acceptor element 110 can easily capture electrons from the localized band formation element 120, which is doped to the host material 100 and has smaller electronegativity than electronegativity of at least one of the elements which compose the host material 100 and as a result, the localized band 240 filled with electrons is formed near to the acceptor level 230.

Here, when the acceptor level 230 is higher than the top of the localized band 240, the acceptor element 110 cannot receive electrons from the localized band 240 without thermal energy. Therefore, the acceptor element 110 and the localized band formation element 120 are selected so that the acceptor level 230 is lower than the top of the localized band 240.

Additionally, when the amount of the localized band formation element 120 is smaller than the amount of the acceptor element 110, the width of the localized band 240 becomes very narrow and it is difficult to conduct electricity in the localized band 240. Therefore, the localized band formation element 120 and the acceptor element 110 are doped so that the amount of the localized band formation element 120 is larger than the amount of the acceptor element 110.

Then, when the concentration of the localized band formation element 120 is high, the width of the forbidden band 220 becomes narrower and the characteristics of the host material 100 become weaker. Therefore, it is desirable that the amount of the localized band formation element 120 is 2 atom % or less.

Additionally, when the acceptor element 110 and the localized band formation element 120 are distributed in non-uniform space of the host material 100, the localized band 240 is formed in a spatially narrow part and at an energetically deep level, which prevents the conduction of electricity in the localized band 240. Therefore, the acceptor element 110 and the localized band formation element 120 are doped so that they are distributed uniformly in the host material 100.

As is described above, by the p-type semiconductor according to the present embodiment, the acceptor level 230 is formed lower than the top of the localized band 240. Therefore, since the p-type semiconductor activates all the holes in the acceptor level 230 and can realize a p-type semiconductor with high concentration of hole carriers, it is possible to realize a p-type semiconductor with low resistance.

Additionally, by the p-type semiconductor according to the present embodiment, all the holes in the acceptor level 230 are activated, and the p-type semiconductor has an extremely high concentration of hole carriers. Therefore, in a p-type semiconductor on which a metal electrode is contacted, the p-type semiconductor can restrain the increase of contact resistance caused by a Schottky barrier. Additionally, by doping the localized band formation element 120 in order to heighten the concentration of the localized band formation element 120 in the contact part with a metal and by widening the band width of the localized band 240 in the contact part with the metal, the p-type semiconductor can further restrain the increase of the contact resistance.

Moreover, by the p-type semiconductor according to the present embodiment, the holes move through the localized band 240. Therefore, in the p-type semiconductor contacted with a semiconductor, the p-type semiconductor can flow electricity to the contacted semiconductor with low resistance when the bottom of the localized band 240 is lower than the top of the valence band of the semiconductor or the energy gap between the bottom of the localized band 240 and the top of the valence band of the semiconductor is smaller than the thermal energy at the temperature when the p-type semiconductor is used.

By the way, in the p-type semiconductor according the present embodiment, the acceptor element 110 is doped to form the acceptor level 230. However, by using a semiconductor having a crystal defect as the host material 100, it is acceptable for the p-type semiconductor to not include the acceptor element 110. Here, a semiconductor having a crystal defect is, for example, a Group III nitride semiconductor having a crystal defect caused by the missing of a Group III element and a Group II oxide semiconductor having a crystal defect caused by the missing of a Group II element.

Additionally, in the p-type semiconductor according to the present embodiment, the acceptor element 110 and the localized band formation element 120 are selected so that the acceptor level 230 is lower than the top of the localized band 240. However, it is acceptable to select the acceptor element 110 and the localized band formation element 120 so that the acceptor level 230 is higher than the top of the localized band 240 and the energy gap between the acceptor level 230 and the top of the localized band 240 is lower than the thermal energy at the temperature when the p-type semiconductor is used.

The First Example

Next, a concrete example of the p-type semiconductor according to the present embodiment is shown by an example.

The p-type gallium nitride semiconductor according to the present example is manufactured by using trimethyl gallium (hereinafter, TMG) as the source gas of gallium, using ammonia as the source gas of nitrogen, using biscyclopentagienyl magnesium as the source gas of magnesium, using phosphine as the source gas of phosphorus, and executing epitaxial growth on a sapphire substrate by the MOCVD method. Here, the amount of phosphorus is, for example, about 2 atom %. By the way, in the present example, as a method for manufacturing the p-type gallium nitride semiconductor, the MOCVD method is exemplified. However, it is acceptable that the p-type gallium nitride semiconductor is manufactured by the MBE method, using metal gallium, metal magnesium, indium phosphide and nitrogen source generated by plasma.

Figure 3:
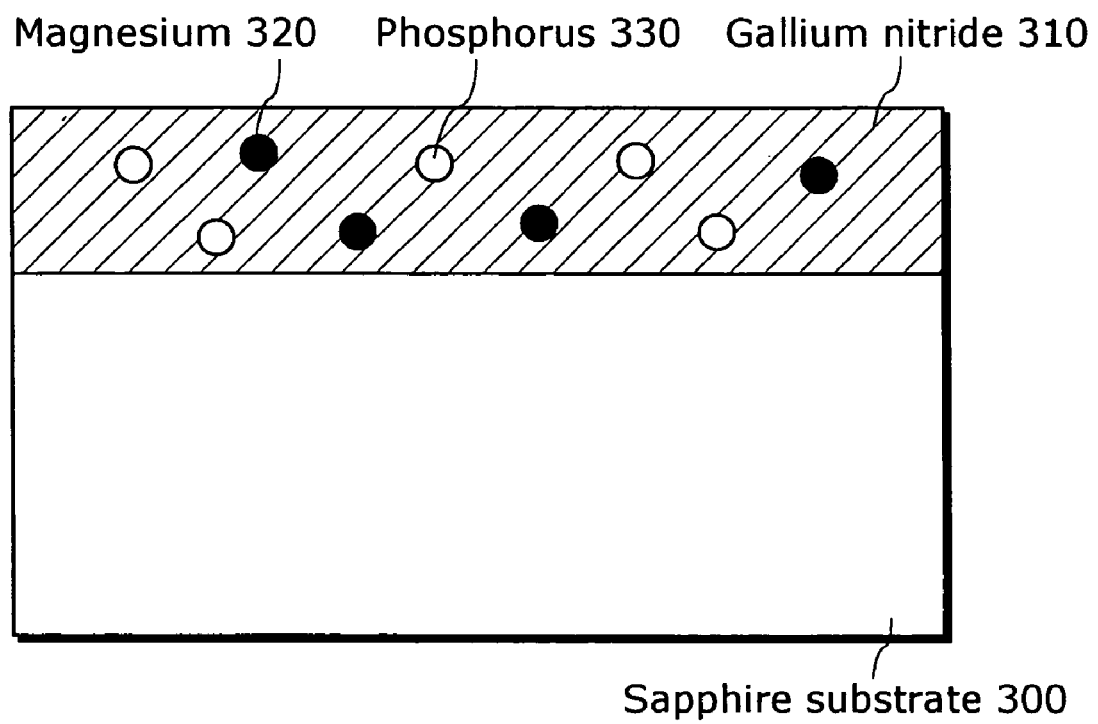
FIG. 3 is a diagram showing a cross section structure of the p-type gallium nitride semiconductor according to the first example of the present invention.

FIG. 3 is a diagram showing a cross section structure of the p-type gallium nitride semiconductor according to the present example manufactured by the above-mentioned method.

In FIG. 3, the gallium nitride semiconductor is formed on a sapphire substrate 300. Here, the p-type nitrogen gallium semiconductor is composed of gallium nitride 310, magnesium 320 doped to gallium nitride 310 and phosphorus 330 doped to gallium nitride 310.

Figure 4:
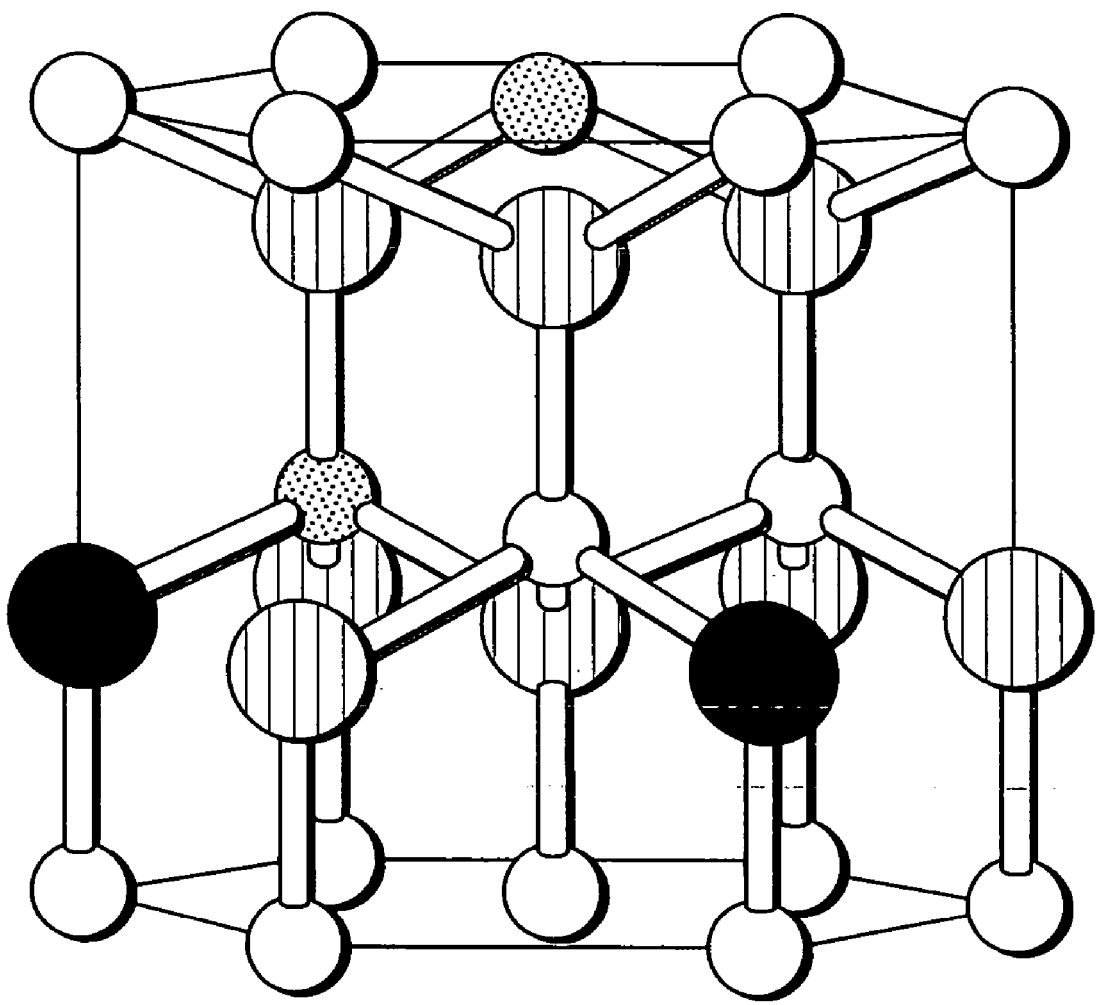
FIG. 4 is a diagram showing a crystal structure model of the p-type gallium nitride semiconductor according to the first example.
Figure 4:
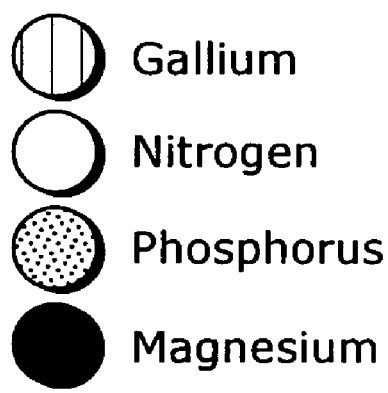

FIG. 4 is a diagram showing a crystal structure model of the p-type gallium nitride semiconductor according to the present example.

In FIG. 4, phosphorus 330 is in a site of nitrogen of the crystal structure of gallium nitride 310; magnesium 320 is in a site of gallium. Here, the crystal structure of gallium nitride 310 is a wurtzite structure. By the way, the crystal structure of gallium nitride 310 may be a rock salt structure.

Figure 5:
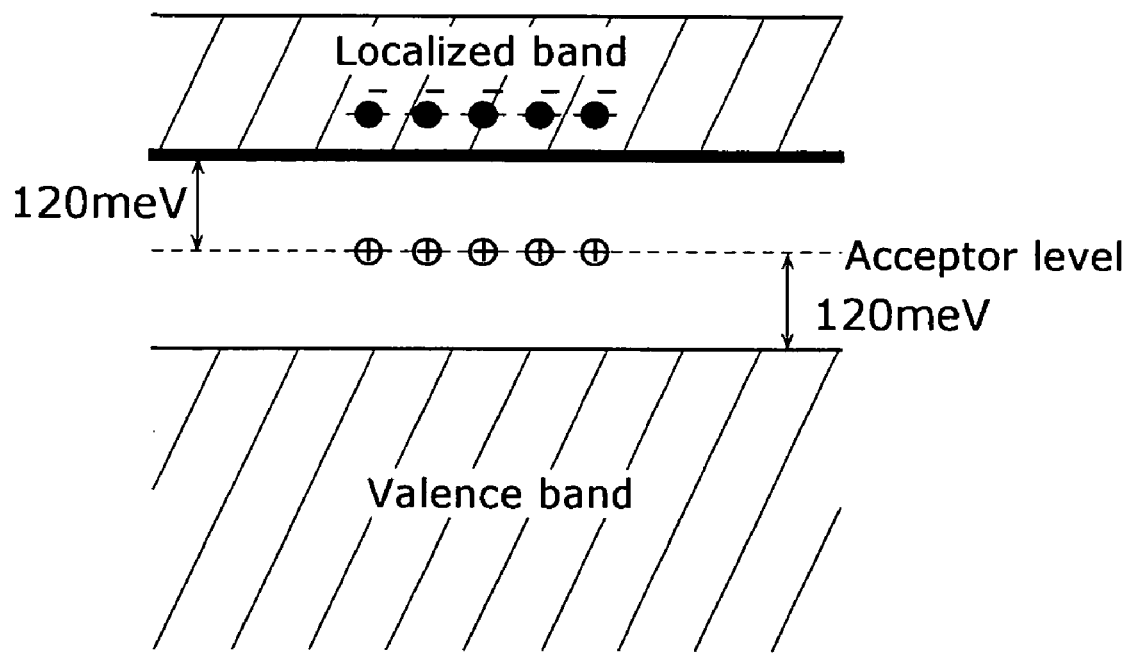
FIG. 5 is diagram showing the band structure of the p-type gallium nitride semiconductor according to the first example.

FIG. 5 is diagram showing the band structure of the p-type gallium nitride semiconductor according to the present example.

In FIG. 5, the acceptor level is formed at a level 120 meV higher than the top of the valence band; the localized band is formed at a level 240 meV higher than the top of the valence band. Here, the acceptor level is formed by doping magnesium 320 to gallium nitride 310; the localized band is formed by doping phosphorus 330 to gallium nitride 310. Since the bottom of the localized band is at 120 meV higher than the acceptor level, magnesium 320 accepts electrons from the localized band and leaves holes in the localized band. The present inventor supposes that the mechanism for forming the localized band is as follows. When phosphorus 330 is not doped to the p-type nitride gallium semiconductor, electrons at the top of the valence band of the p-type gallium nitride semiconductor are localized in nitrogen having large electronegativity. However, by doping phosphorus 330 to the to p-type gallium nitride semiconductor, as is shown in FIG. 4, phosphorus 330 having smaller electronegativity than nitrogen is substituted into nitrogen; as the result, the localized band filled with electrons are formed at a level higher than the acceptor level in the band structure shown in FIG. 5.

By the p-type gallium nitride semiconductor according to the present example, since the bottom of the localized band which is formed by doping phosphorus 330 to gallium nitride 310 is at a level higher than the acceptor level which is formed by doping magnesium 320 to gallium nitride 310 and it is possible to activate all the holes in the acceptor level, it is possible to realize the p-type gallium nitride semiconductor with low resistance.

By the way, the p-type gallium nitride semiconductor is exemplified in the present example. However, it is possible to realize a p-type zinc oxide semiconductor with low resistance by doping nitrogen as the acceptor element 110 to zinc oxide and doping sulfur as the localized band formation element 120.

The Second Embodiment

In host material 100 of the p-type semiconductor according to the first embodiment, acceptor element 110 and localized band formation element 120 are doped uniformly. However, even if the part including the acceptor element 110 and the part including the localized band formation element 120 are separated spatially, the same effect in the case of being not separated spatially is obtained. Further, in this case, since it is possible to separate spatially the part transmitting the holes and the part generating the holes and restrain the dispersion of the holes, it is possible to realize the p-type semiconductor with further low resistance. Therefore, in the p-type semiconductor according to the second embodiment, the host material including the acceptor element 110 and the host material including the localized band formation element 120 are separated spatially. Hereinafter, the different points from the first embodiments are mainly explained.

Figure 6:
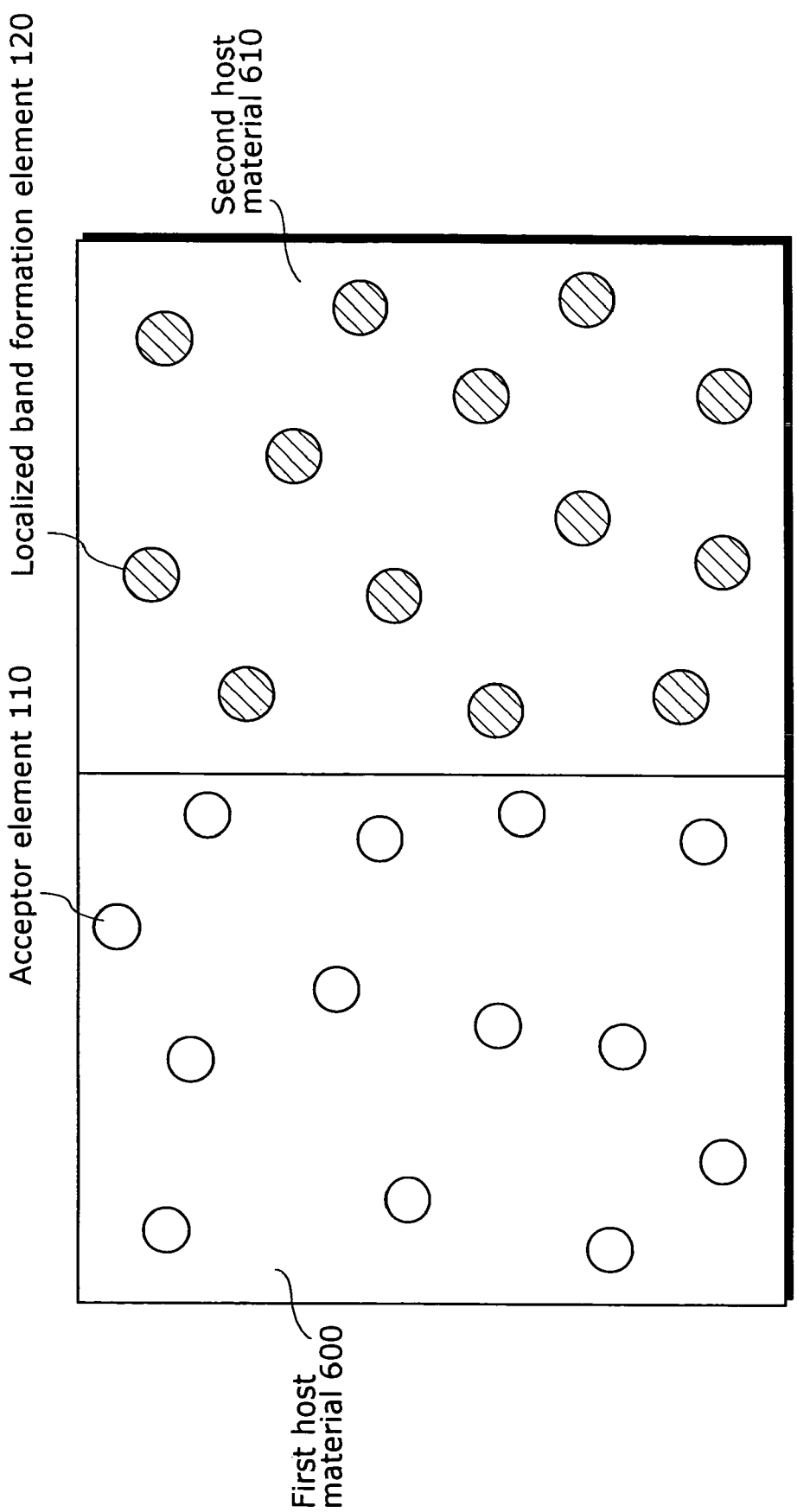
FIG. 6 is a diagram showing conceptually the structure of the p-type semiconductor according to the second embodiment of the present invention.

FIG. 6 is a diagram showing conceptually the structure of the p-type semiconductor according to the present embodiment.

It should be noted that the same reference numbers are assigned to the same elements in the first embodiment and their explanations are omitted here.

The p-type semiconductor according to the present embodiment is composed of the acceptor element 110, the localized band formation element 120, the first host material 600, and the second host material 610.

Here, the first host material 600 is the same semiconductor as the host material 100 according to the first embodiment but different from the host material 100 in that the acceptor element 110 is doped and the localized band formation element 120 is not doped to the first host material 600.

Additionally, the second host material 610 is the same semiconductor as the host material 100 according to the first embodiment but different from the host material 100 in that the localized band formation element 120 is doped and the acceptor element 110 is not doped to the second host material 610.

The first host material 600 and the second host material 610 are the same semiconductor. By the way, the first host material 600 and the second host material 610 may be semiconductors with different constituent elements, compositions and crystal structures.

Figure 7A:
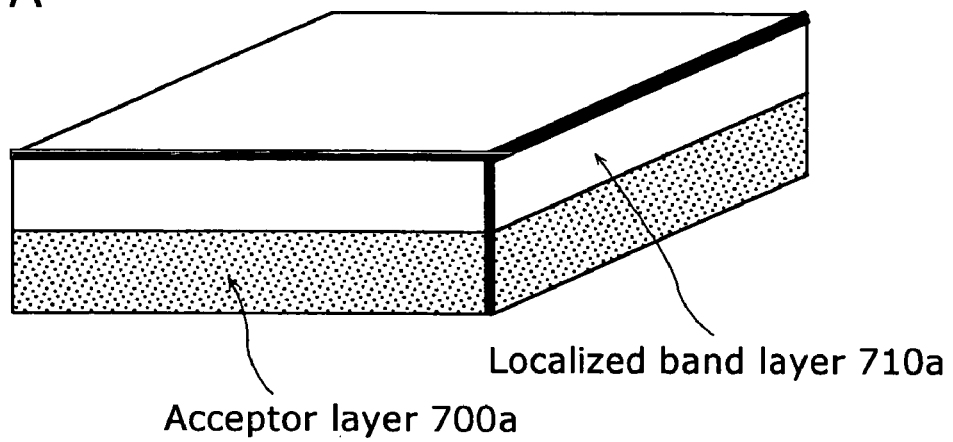
FIG. 7A and FIG. 7b are diagrams showing the structure of the p-type semiconductor according to a second embodiment.
Figure 7B:
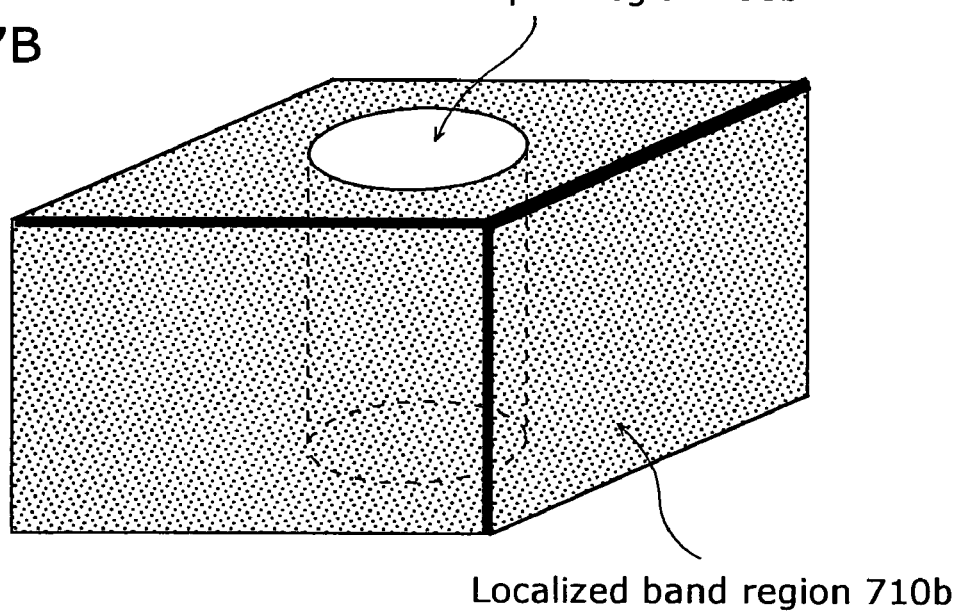

FIG. 7A and FIG. 7B are diagrams showing the structure of the p-type semiconductor according to the present embodiment.

As is shown in FIG. 7A, the p-type semiconductor is composed of: an acceptor layer 700a made of the first host material 600 to which the acceptor element 110 is doped; and a localized band layer 710a made of the second host material 610 to which the localized band formation element 120 is doped. By the way, as is shown in FIG. 7B, the p-type semiconductor may be composed of: a cylindrical acceptor region 700b made of the first host material 600 to which the acceptor element 110 is doped; and a localized band region 710b with a shape covering the cylindrical part and made of the second host material 610 to which the localized band formation element 120 is doped.

The p-type semiconductor having the structure like this is manufactured by the similar method to the first embodiment.

Figure 8:
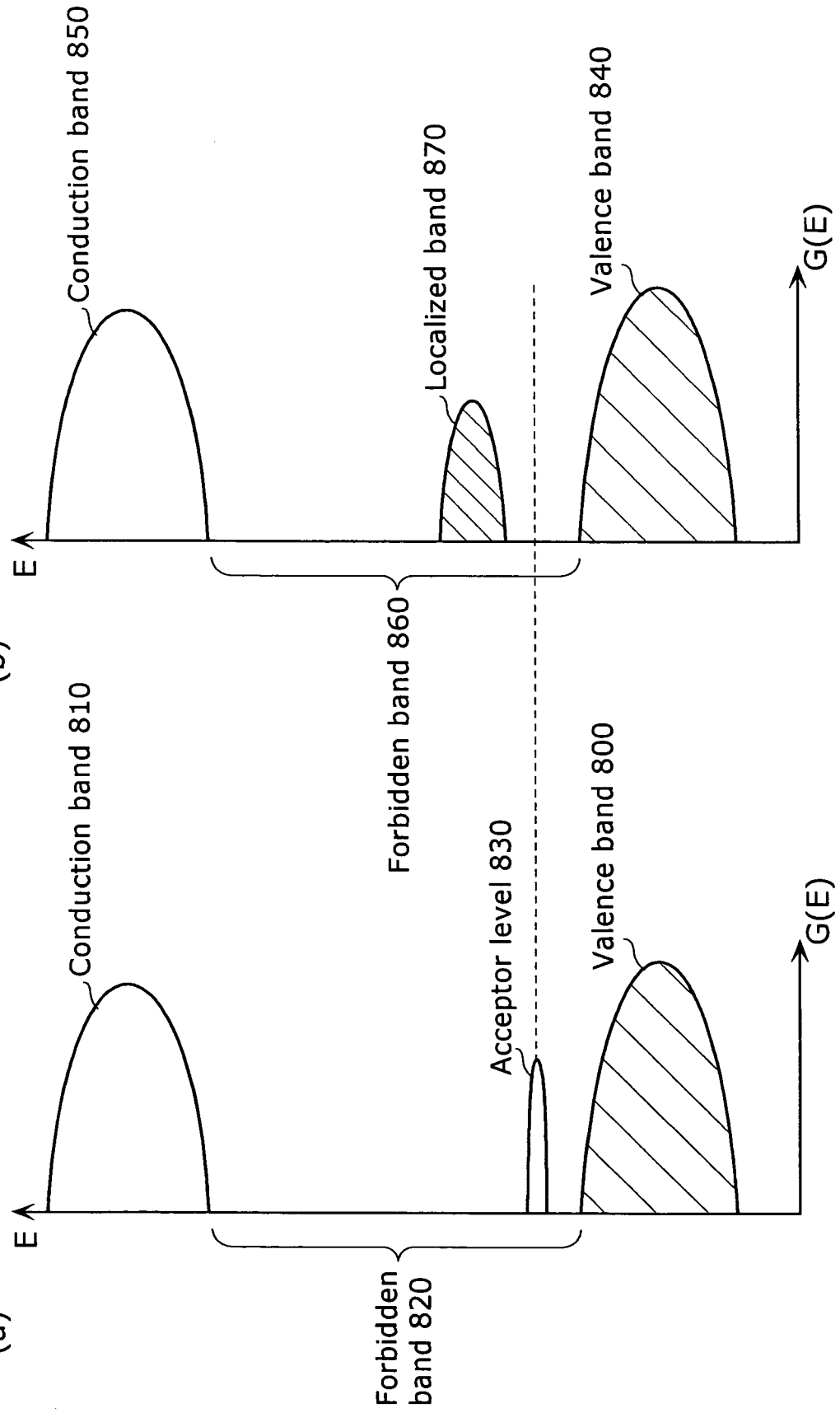
FIG. 8A and FIG. 8B are diagrams showing the energy structures of the p-type semiconductor according to the second embodiment.

FIG. 8A and FIG. 8B are diagrams showing the energy structures of the p-type semiconductor according to the present embodiment. The vertical axis represents energy and the horizontal axis represents state density in FIG. 8A and FIG. 8B.

FIG. 8A shows the energy structure of the acceptor layer 700a and FIG. 8B shows the energy structure of the localized band layer 710a.

In FIG. 8A, an acceptor level 830 is formed near to a valence band 800 in a forbidden band 820. Here, the acceptor level 830 is formed by doping the acceptor element 110 to the first host material 600. In FIG. 8B, a localized band 870 is formed near to the acceptor level 830 in a forbidden band 860. Here, the localized band 870 is filled with electrons and is formed by doping the localized band formation element 120 to the second host material 610. Since the acceptor layer 700a and the localized band layer 710a contact, the acceptor element 110 accepts electrons from a localized band 870 and leaves holes in the localized band 870.

Here, when the acceptor element 110 and the localized band formation element 120 are separated spatially, it is difficult to conduct electricity in the localized band 870. Therefore, at the boundary between the acceptor layer 700a and the localized band layer 710a, it is desirable to dope the acceptor element 110 and the localized band formation element 120 so that the concentration of the acceptor element 110 becomes high or the acceptor element 110 and the localized band formation element 120 mix.

As is described above, by the p-type semiconductor according to the present embodiment, the first host material 600 including the acceptor element 110 and the second host material 610 including the localized band formation element 120 are separated spatially. Therefore, since the second host material 610 including the localized band element 120 does not include the acceptor element 110 and it is possible to restrain the dispersion of the holes by an acceptor ion, the p-type semiconductor can realize the p-type semiconductor with further low resistance.

Additionally, by the p-type semiconductor according to the present embodiment, it is possible to apply the semiconductors with different constituent elements, compositions and crystal structures to the first host material 600 and the second host material 610, respectively. Therefore, the p-type semiconductor can raise design flexibility of the p-type semiconductor drastically.

The Second Example

Next, a concrete example of the p-type semiconductor according to the present embodiment is shown by an example.

The p-type gallium nitride semiconductor according to the present example is manufactured by using TMG as the source gas of gallium, using ammonia as the source gas of nitrogen, using biscyclopentagienyl magnesium as the source gas of magnesium, using phosphine as the source gas of phosphorus, and executing epitaxial growth on a sapphire substrate.

Figure 9:
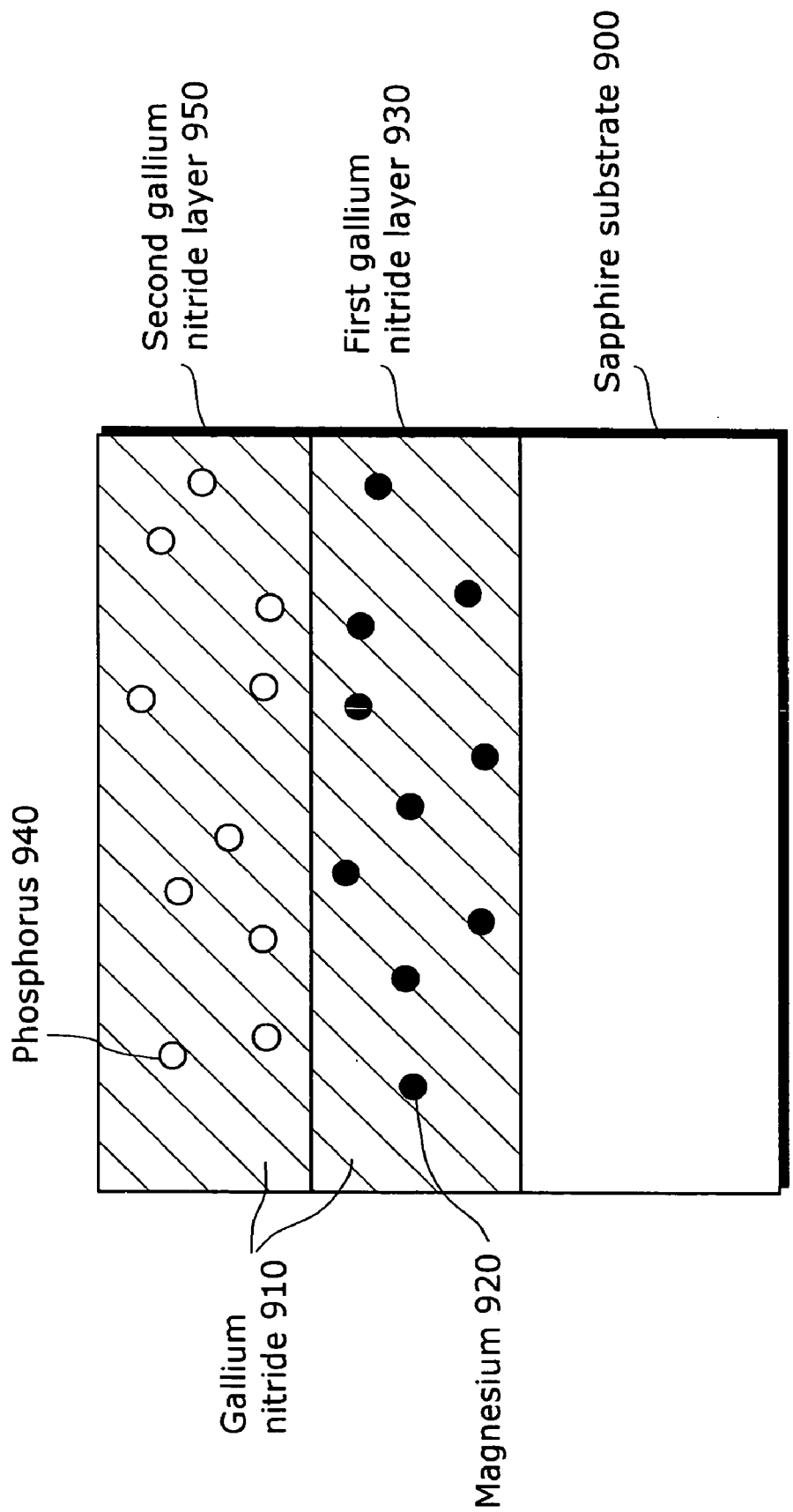
FIG. 9 is a diagram showing a cross section structure of the p-type gallium nitride semiconductor according to the second example of the present invention.

FIG. 9 is a diagram showing a cross section structure of the p-type gallium nitride semiconductor according to the present example manufactured by the method described above.

In FIG. 9, the gallium nitride semiconductor is formed on a sapphire substrate 900. Here, the p-type nitrogen gallium semiconductor is composed of the first gallium nitride layer 930 made of gallium nitride 910 to which magnesium 920 is doped and the second gallium nitride layer 950 made of gallium nitride 910 to which phosphorus 940 is doped.

Figure 10:
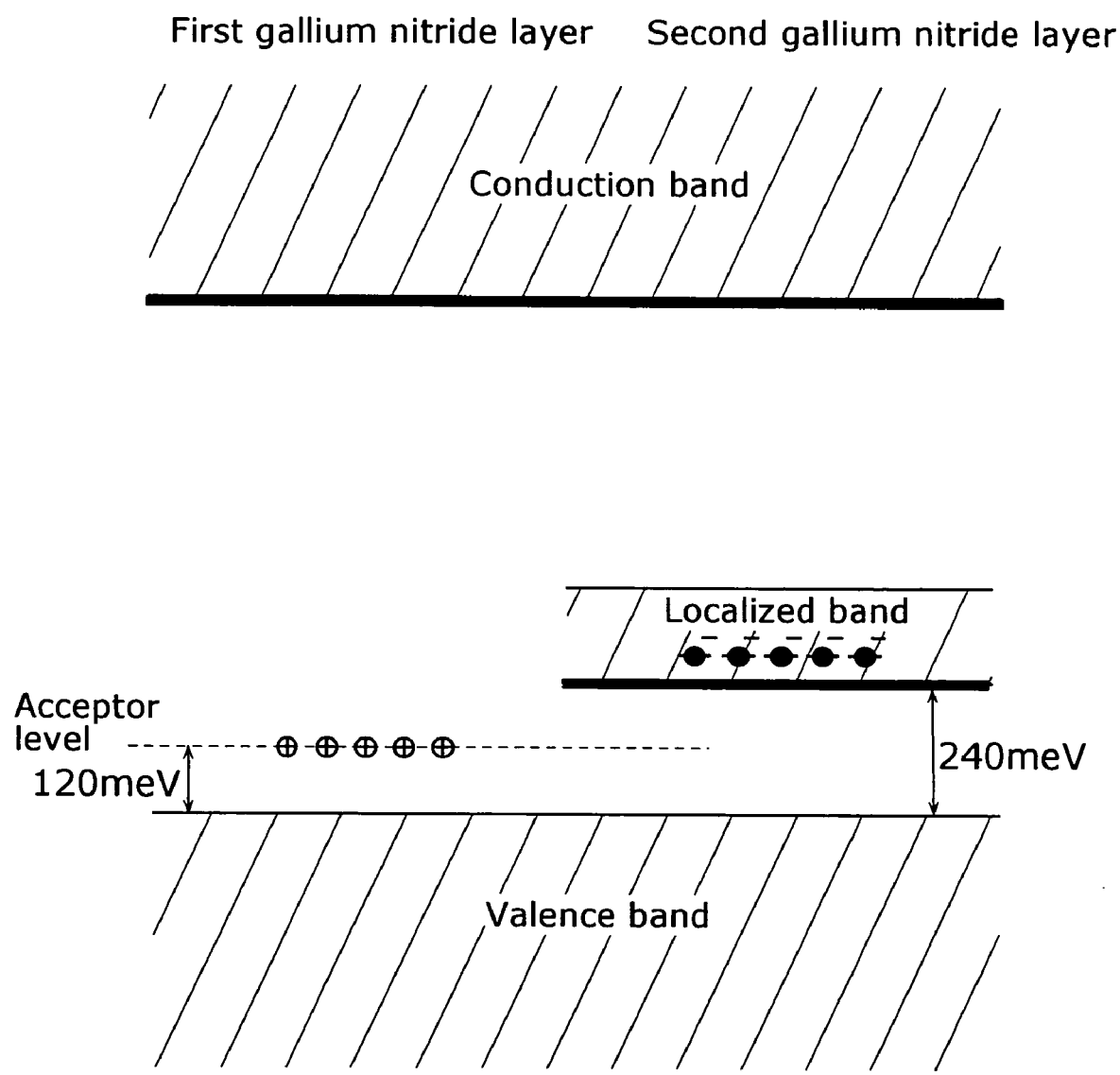
FIG. 10 is a diagram showing the band structure of the p-type gallium nitride semiconductor according to the second example.

FIG. 10 is diagram showing the band structure of the p-type gallium nitride semiconductor according to the present example.

In FIG. 10, the acceptor level is formed at a level 120 meV higher than the top of the valence band of the first gallium nitride layer 930 and the localized band is formed at a level 240 meV higher than the top of the valence band of the second gallium nitride layer 950. Here, the acceptor level is formed by doping magnesium 920 to the gallium nitride 910 and the localized band is formed by doping phosphorus 940 to the gallium nitride 910. Since the bottom of the localized band is at a level 120 meV higher than the acceptor level at the interface between the first gallium nitride layer 930 and the second gallium nitride layer 950, magnesium 920 accepts electrons from the localized band and leaves holes in the localized band.

By the p-type gallium nitride semiconductor according to the present example, magnesium 920 doped to gallium nitride 910 has the acceptor level in the forbidden band of the first gallium nitride layer 930 and phosphorus 940 doped to gallium nitride 910 has the localized band in the forbidden band of the second gallium nitride layer 950. Therefore, since holes transmitted through localized band do not receive dispersion by magnesium ion, the p-type gallium nitride semiconductor realizes the p-type gallium nitride semiconductor with further low resistance.

By the way, in the present example, the p-type semiconductor having one kind of semiconductor, namely gallium nitride 910, as the host material is exemplified. However, it is possible to realize the p-type semiconductor with low resistance using two kinds of different semiconductors as the host material by forming, on a sapphire substrate, a layer made of gallium nitride to which phosphorus is doped and forming, on the layer, a layer made of gallium nitride to which magnesium is doped.

The Third Embodiment

By using the p-type semiconductor according to the first and second embodiments for a semiconductor device, it is possible to improve activation efficiency of holes of the p-type semiconductor and to lower ohmic resistance with an electrode and electric resistance in the p-type semiconductor. Therefore, it is possible to solve the problem that reliability decreases because of heat generation caused by the activation efficiency of the holes.

However, in a semiconductor device, besides the ohmic resistance with the electrode and the electric resistance in the semiconductor, high electric resistance exists in a hetero-junction part. Therefore, simply using the p-type semiconductor for the semiconductor device cannot solve the problem that reliability decreases because of heat generation caused by the electric resistance in the hetero-junction part.

Accordingly, the hetero-junction semiconductor material using the p-type semiconductor according to the present embodiment aims to realize a hetero-junction semiconductor material which reduces the electric resistance in the hetero-junction part and decreases the electric resistance component appearing in the current/voltage characteristic.

The hetero-junction semiconductor material according to the embodiment of the present invention will be explained below with reference to figures.

Figure 11:
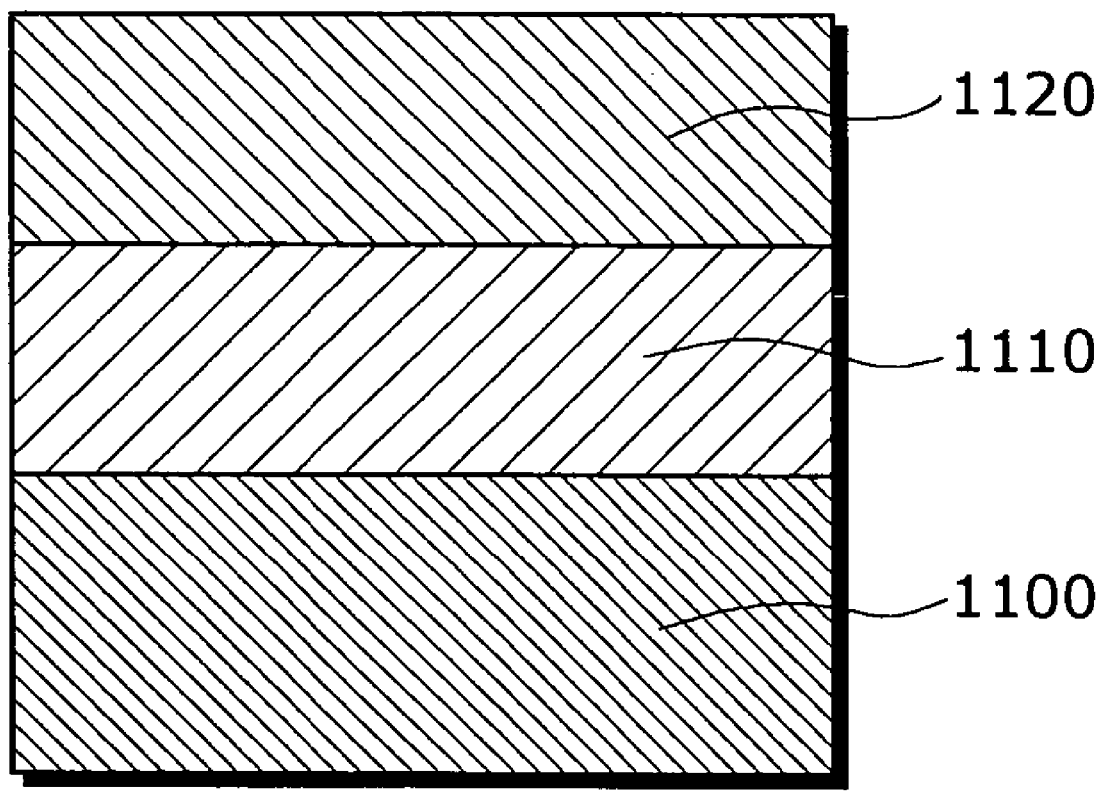
FIG. 11 is a cross sectional structure of the hetero-junction semiconductor material according to a third embodiment of the present invention.

FIG. 11 is the cross sectional structure of the hetero-junction semiconductor material according to the present embodiment.

The hetero-junction semiconductor material aims to improve the activation efficiency of holes and to reduce the electric resistance component appearing in current/voltage characteristic of the hetero-junction semiconductor material. The hetero-junction semiconductor material is composed of: a p-type semiconductor layer 1110, which generates the holes, formed on the semiconductor substrate 1100; and a target material layer 1120, to which the holes are implanted, formed on the semiconductor layer 1110. By the way, an intermediate layer where the composition of each layer mixes may be formed between the p-type semiconductor layer 1110 and the target material layer 1120.

Here, the semiconductor substrate 1100 is a substrate of sapphire, silicon, silicon carbide, gallium arsenide, zirconium boride, magnesium aluminum complex oxide, lithium gallium complex oxide, gallium nitride or the like.

Figure 12:
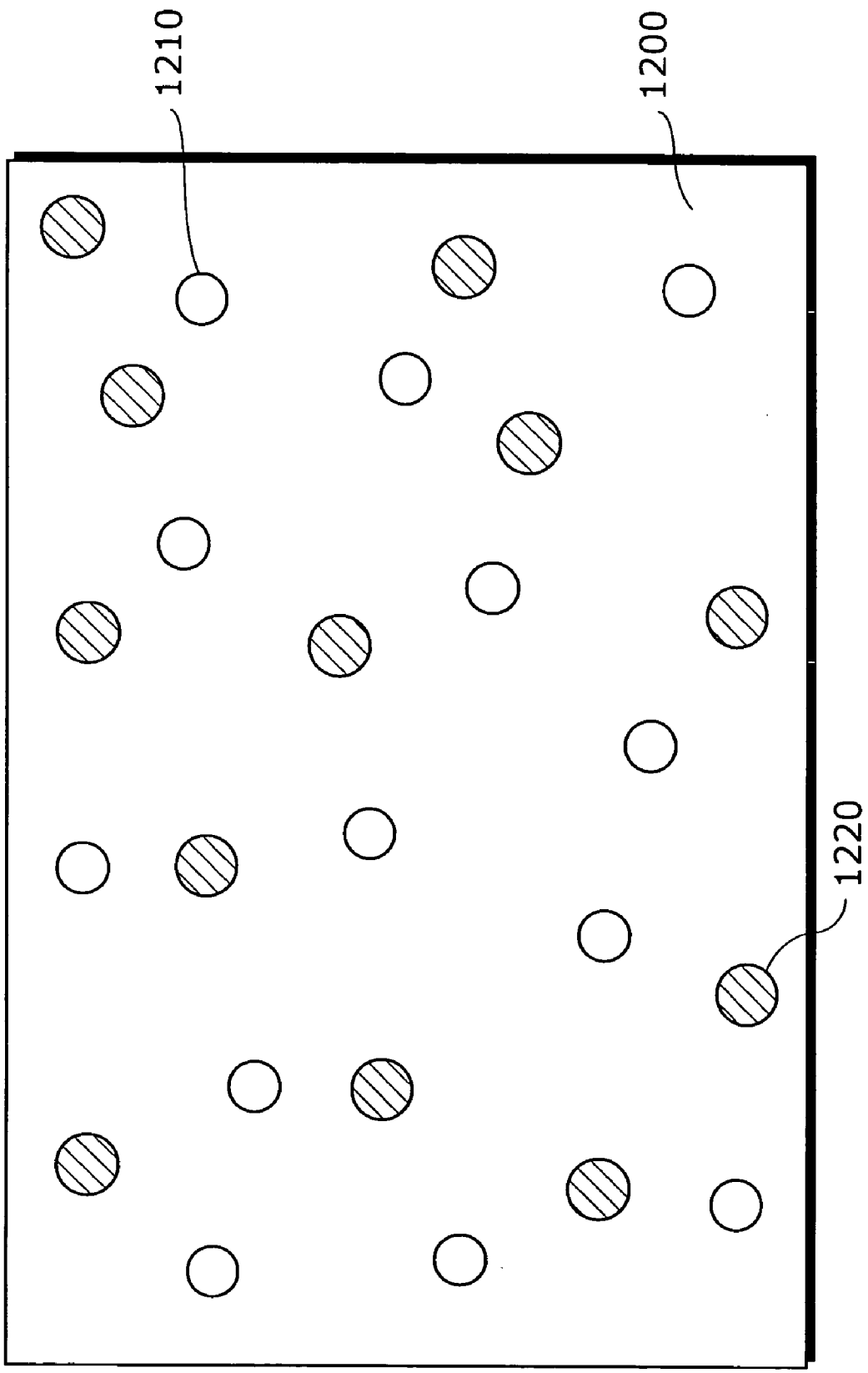
FIG. 12 is a diagram showing conceptually the structure of the p-type semiconductor layer 110 according to the third embodiment.

Additionally, the p-type semiconductor layer 1110 is, as is shown in FIG. 12, a layer made by doping the acceptor element 1210 and the localized band formation element 1220 to the host material 1200. Here, the host material 1200 is a single element semiconductor represented by a silicon semiconductor, a germanium semiconductor and a diamond semiconductor, or a compound semiconductor represented by a nitride semiconductor, an oxide semiconductor and a fluoride semiconductor; the acceptor element 1210 has the fewer valence electrons than at least one of the elements which compose the host material 1200; and the localized band formation element 1220 is isovalent with at least one of the elements which compose the host material 1200 and smaller electronegativity than electronegativity of the element(s). By the way, the p-type semiconductor layer 1110 may have an amorphous structure or a polycrystalline structure.

Additionally, the target material layer 1120 is the semiconductor layer one constituent element of which has smaller electron affinity than the electron affinity of at least one of the elements which compose the p-type semiconductor layer 1110 (for example, concrete examples, A1, A2 and A3 are mentioned below). By the way, the target material layer 1120 has a smaller lattice constant than the lattice constant of the p-type semiconductor layer 1110 and may have a tensile distortion in the junction part with the p-type semiconductor layer 1110 (for example, a concrete example, A4 is mentioned below).

Concrete Example A1

The p-type semiconductor layer 1110: p-ZnSe; the localized band formation element 1220: Te; and the target material layer 1120: ZnSe.

Concrete Example A2

The p-type semiconductor layer 1110: p-ZnSSe; the localized band formation element 1220: Te; and the target material layer: ZnSe.

Concrete Example A3

The p-type semiconductor layer 1110: p-Sic; the localized band formation element 1220: Ge; the target material layer 1220: Si.

Concrete Example A4

The p-type semiconductor layer 1110: p-AIN; the localized band formation element 1220: P; the target material layer 1120: InGaN.

The hetero-junction semiconductor material having the structure described above is manufactured by: (1) forming one or more semiconductor layers on the semiconductor substrate 1100 by crystal growth method; (2) forming, on the semiconductor layer(s), the p-type semiconductor layer 1110 and the target material layer 1120 in sequence; and then (3) doping the localized band formation element 1220 and the acceptor element 1210 to the part (depth: 0.1 μm) of the p-type semiconductor layer 1110 which contacts with the target material layer 1120 by the ion implantation method or the diffusion method.

Figure 13:
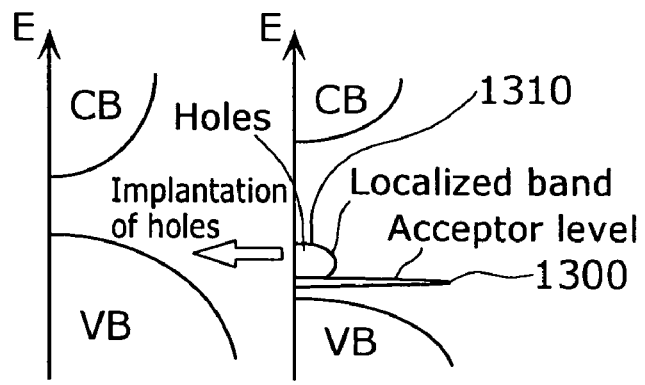
FIG. 13 is a diagram showing the energy structure of the hetero-junction semiconductor material according to the third embodiment.

FIG. 13 is a diagram showing the energy structure of the hetero-junction semiconductor material according to the embodiment of the present invention. In FIG. 13, the vertical axis represents energy and the horizontal axis represents state density. By the way, in FIG. 13, the left side shows the energy structure of the target material layer 1120; the right side shows the energy structure of the p-type semiconductor layer 1110.

In FIG. 13, an acceptor level 1300 is formed near the valence band (hereinafter the valence band is referred to as VB; on the other hand, the conduction band is referred to as CB) in the forbidden band of the p-type semiconductor layer

1110; a localized band 1310 is formed near the acceptor level 1300 and at the same or lower energy level than the top of VB of the target material layer 1120. Here, the acceptor level 1300 is formed by doping the acceptor element 1210 to the host material 1200; the localized band 1310 is filled with electrons and is formed by doping the localized band formation element 1220 to the host material 1200.

In the hetero-junction semiconductor material having the energy structure described above, since the electrons in the localized band 1310 move to the acceptor level 1300, holes generated in the localized band 1310 move to the VB of the target material layer 1120. By the way, since the acceptor element 1210 and the localized band formation element 1200 are selected so that the acceptor level 1300 is formed at the lower energy level than the top of the localized band 1310, the electrons of the localized band 1310 move to the acceptor level 1300 without thermal energy. Additionally, since the localized band formation element 1220 and the acceptor element 1210 are doped so that the amount of the localized band formation element 1220 is larger than the amount of the acceptor element 1210, the localized band 1310 with an extremely wide width is formed and the holes generated in the localized band 1310 do not receive high resistance and move to the VB of the target material layer 1120.

As is described above, by the hetero-junction semiconductor material according to the present embodiment, the localized band 1310 is formed at the higher energy level of the acceptor level 1300 and at the same or lower energy level than the top of VB of the target material layer 1120. Therefore, since it is possible to activate all the holes in the acceptor level and to reduce electrical resistance at the hetero-junction part, the hetero-junction semiconductor material can realize the hetero-junction semiconductor material which improves the activation efficiency of the holes and reduce the electric resistance component appearing in the current/voltage characteristic of the hetero-junction semiconductor material.

Additionally, in the hetero-junction semiconductor material according to the present embodiment, an intermediate layer where each composition mixes may be formed between the p-type semiconductor layer 1110 and the target material layer 1120. Therefore, since the trapping of the holes in the interface between the p-type semiconductor layer 1110 and the target material layer 1120 is reduced and it is possible to reduce the electrical resistance of the hetero-junction part, the hetero-junction semiconductor material can realize the hetero-junction semiconductor material which further reduces the electric resistance component appearing in the current/voltage characteristic of the hetero-junction semiconductor material.

By the way, a defect and a dangling bond in the junction part between the p-type semiconductor layer 1110 and the target material layer 1120 may be removed. Hereby, since there is no interfacial pinning and the localized band 1310 is not affected by the defect and the dangling bond, it is possible to reduce the electric resistance at the hetero-junction part and to further reduce the electric resistance component appearing in the current/voltage characteristic of the hetero-junction semiconductor material.

Additionally, in the junction part between the p-type semiconductor layer 1110 and the target material layer 1120, it is acceptable that one or both of the plane directions of both layers and the direction of the atomic arrangements in the plane are different.

Moreover, it is acceptable that the p-type semiconductor layer 1110 and the target material layer 1120 have different crystal structures; and for example, the p-type semiconductor layer 1110 has a cubic crystal and the target material layer 1120 has a hexagonal crystal.

Additionally, as for the hetero-junction semiconductor material according to the present invention, if an electrode is formed in the p-type semiconductor layer 1110 or the target material layer 1120, it is possible to obtain a good p-type ohmic electrode. And a p-type ohmic electrode having the structure like this can be used for a semiconductor device of, for example, a semiconductor laser, a light-emitting diode, a bipolar transistor, a field-effect transistor and the like and can improve their current/voltage characteristic.

Moreover, in the hetero-junction semiconductor material according to the present invention, the acceptor element 1210 is doped only to the p-type semiconductor layer 1110. But it is acceptable that the acceptor element 1210 is doped not only to the p-type semiconductor layer 1110 but also to the target material layer 1120. At this time, the hetero-junction semiconductor material is manufactured by (1) doping the acceptor element 1210 and the localized band formation element 1220 to the region of the p-type semiconductor layer 1110 near to the interface between the p-type semiconductor layer 1110 and the target material layer 1120 by the ion implantation method or the diffusion method; and later (2) further doping the acceptor element 1210 to the region of the target material layer 1120 near to the interface between the p-type semiconductor layer 1110 and the target material layer 1120 by the ion implantation method or the diffusion method. Here, it is acceptable to use the co-implantation method for ion-implanting both of the acceptor element 1210 and the localized band formation element 1220. Hereby, since it is possible to form a p-type semiconductor region with a locally high concentration at an arbitrary depth in the semiconductor, a part of an n-type region which is difficult to reverse to a p-type region can be reversed to a p-type region. Therefore, it is possible to realize a device with a complex semiconductor heterostructure. It is acceptable to dope a localized band formation element to a conventional p-type semiconductor by ion implantation. For example, there is a case of ion-implanting phosphorus, with low accelerating voltage, to gallium nitride, to which magnesium is doped, as the conventional p-type semiconductor. In this case, since a layer with an extremely high concentration of holes can be formed as a surface layer, it is possible to reduce substantially contact resistance with an electrode. By the way, it is effective to co-implant gallium with phosphorus to gallium nitride to which magnesium is doped in order to restrain vacancy at nitrogen or gallium site.

Additionally, in the hetero-junction semiconductor material according to the present embodiment, the acceptor element 1210 and the localized band formation element 1220 are selected so that the acceptor level 1300 is lower than the top of the localized band 1310. However, it is acceptable to select the acceptor element 1210 and the localized band formation element 1220 so that the acceptor level 1300 is higher than the top of the localized band 1310 and the energy gap between the acceptor level 1300 and the top of the localized band 1310 is lower than the thermal energy at room temperature.

Moreover, one or more semiconductor layers are formed on the semiconductor substrate 1100. However, it is acceptable to use the p-type semiconductor layer 1100 as the buffer layer and not to form one or more semiconductor layers on the semiconductor substrate 1100.

Figure 14:
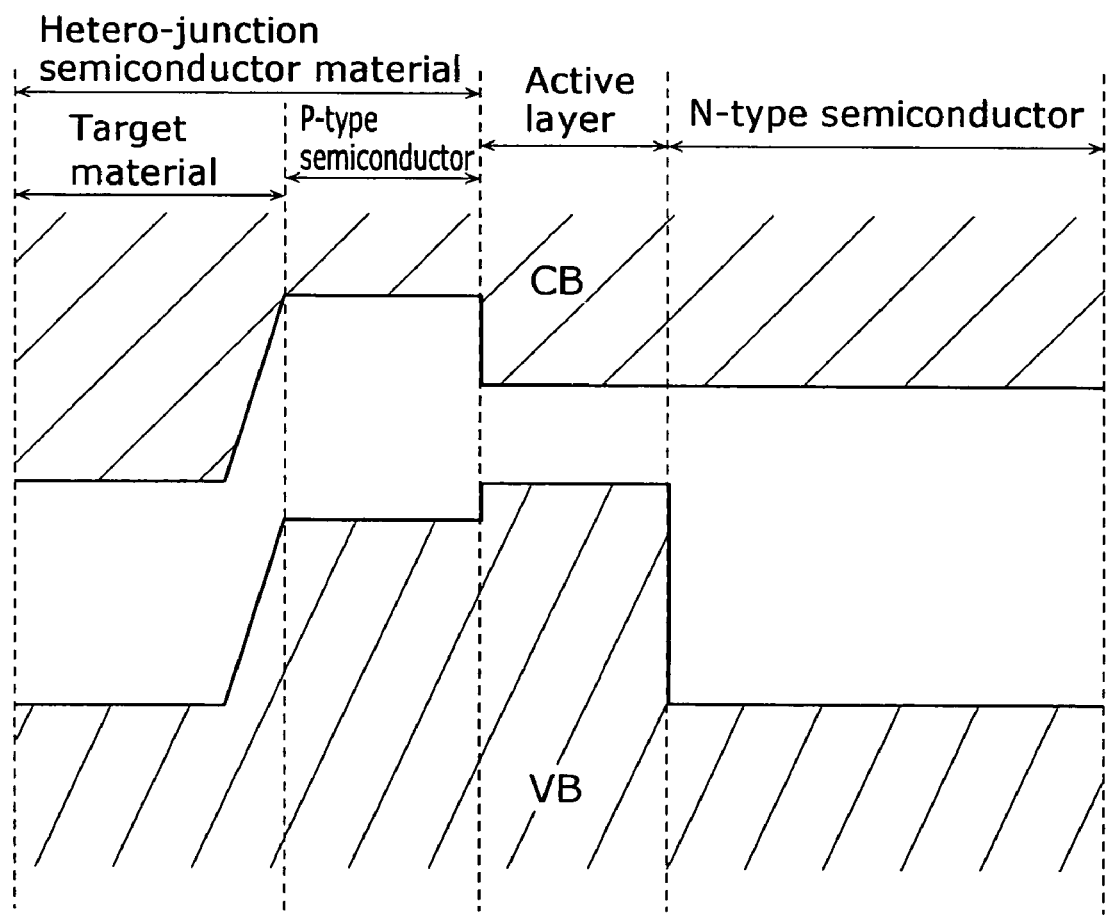
FIG. 14 is a diagram showing the energy structure of a unipolar device using the hetero-junction semiconductor material according to the third embodiment.

Additionally, it is acceptable that the target material layer 1120 is an n-type semiconductor with high concentration. In this case, by contacting an active layer and the n-type semiconductor layer to the hetero-junction semiconductor material, the hetero-junction semiconductor material can realize a unipolar device having the energy structure shown in FIG. 14 and it is possible to omit the process of forming an electrode on the p-type semiconductor layer.

The Third Example

Next, a concrete example of the hetero-junction semiconductor material according to the present embodiment is shown by an example.

Figure 15:
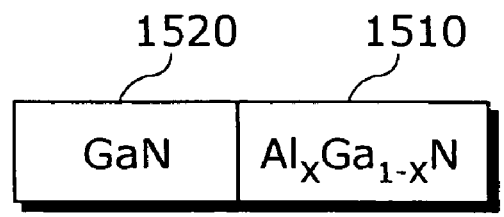
FIG. 15 is a diagram showing the structure of the hetero-junction semiconductor material using gallium nitride material according to the third example of the present invention.

FIG. 15 is a diagram showing the structure of the hetero-junction semiconductor material using gallium nitride material according to the present example.

The hetero-junction semiconductor material is composed of the $Al_xGa_{1-x}N$ ($0 \leq x \leq 1$) layer 1510 as a p-type semiconductor layer 1110 and GaN layer 1520 as a target material layer. To the $Al_xGa_{1-x}N$ layer 1510, magnesium as the acceptor element 1210 and arsenic as the localized band formation element 1120 are doped. By the way, $B_yAl_xGa_{1-x-y}N$ ($0 \leq x \leq 1$, $0 \leq y \leq 1$) may be used as the p-type semiconductor layer 1110; $Al_xIn_yGa_{1-x-y}N$ ($0 \leq x \leq 1$, $0 \leq y \leq 1$) may be used as the target material layer 1120; and phosphorus may be used as the localized band formation element 1220.

The hetero-junction semiconductor material having the structure described above is manufactured by (1) executing epitaxial growth to the $Al_xGa_{1-x}N$ layer 1510 and GaN layer 1520 on a sapphire substrate by a crystal growth method; and then (2) doping arsenic and magnesium to a part of $Al_xGa_{1-x}N$ layer 1510 which is near to the interface with the GaN layer 1520 by the ion implantation method. By the way, arsenic and magnesium may be doped by the diffusion method.

Figure 16:
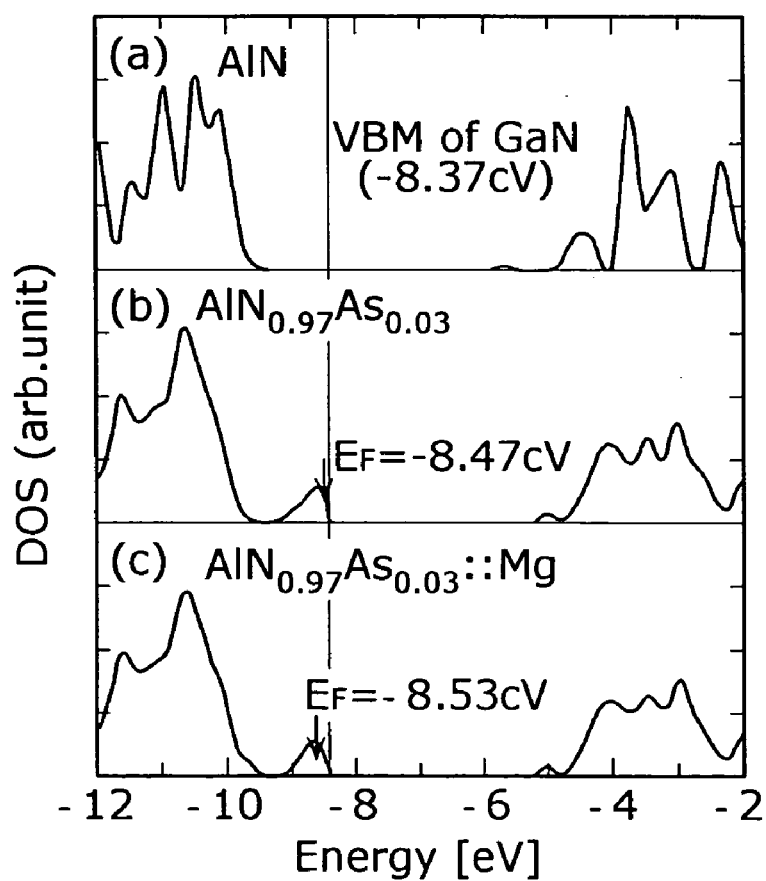
FIG. 16 is a diagram showing the energy structure of the hetero-junction semiconductor material according to the third example.

FIG. 16 is a diagram showing the energy structure of the hetero-junction semiconductor material according to the present example. In FIG. 16, the vertical axis represents an arbitrary unit; the horizontal axis represents energy; and VBM of GaN represents the energy level (−8.37 eV) of the GaN valence band edge. By the way, FIG. 16 is related to the hetero-junction semiconductor material composed of the AlN layer and the GaN layer to which arsenic (doping quantity of arsenic: 3% of the Group III element) and magnesium (doping quantity of magnesium: $10^{20}$ cm$^{-3}$) are doped. FIG. 16(a) shows the energy structure when arsenic and magnesium are not doped; FIG. 16(b) shows the energy structure when only arsenic is doped; and FIG. 16 (c) shows the energy structure when both of arsenic and magnesium are doped.

From FIG. 16, it is apparent that magnesium has the localized band because the localized band is not formed near the GaN band edge when arsenic and magnesium are not doped (FIG. 16(a)) but the localized band is formed near −8.47 eV and −8.53 eV when arsenic is doped (FIG. 16(b) and (c)). Additionally, since the localized band is lowered by doping magnesium, it is apparent that magnesium has the acceptor level at the lower energy level than the top of the localized band. Further, since the localized band is formed at the lower energy level than −8.37 eV, it is apparent that GaN has its valence band edge at the higher energy level than the localized band.

As is described above, by the hetero-junction semiconductor material using the gallium nitride material according to the present example, the localized band is formed at the higher energy level than the acceptor level and at the lower energy level than the top of VB of the GaN layer 1520. Therefore, since it is possible to activate all the holes of the acceptor level and to lower the electrical resistance at the hetero-junction part, the hetero-junction semiconductor material can realize the hetero-junction semiconductor material which improves the activation efficiency of the holes and reduces the electric resistance component appearing in the current/voltage characteristic of the hetero-junction semiconductor material.

By the way, it is acceptable to use the ZnO layer as the p-type semiconductor layer 1110 and the MgO layer as the target material layer 1120; or to use the LiF layer as the p-type semiconductor layer 1110 and $CaF_2$ layer as the target material layer 1120.

Additionally, the $Al_xGa_{1-x}N$ layer 1510 and GaN layer 1520 are formed on a sapphire substrate by epitaxial growth method. However, it is not limited to the sapphire substrate as long as the gallium nitride material is formed by the epitaxial growth method and a silicon carbide substrate and the like are acceptable. Particularly, it is desirable to be the substrate which generates a tensile distortion at the interface between the $Al_xGa_{1-x}N$ layer 1510 and GaN layer 1520, because it is possible to control the localized band by the distortion.

INDUSTRIAL APPLICABILITY

The present invention can be utilized for a p-type semiconductor, and especially can be utilized for hetero-junction semiconductor material.

What is claimed is:

1. A p-type semiconductor comprising a plurality of elements, one of the elements being a localized band formation element, the localized band formation element being isovalent with at least one other of the elements of the p-type semiconductor and having a smaller electronegativity than an electronegativity of the at least one other element, wherein
   another of the elements is an acceptor element, the acceptor element having fewer valence electrons than valence electrons of at least one other of the elements of the p-type semiconductor,
   an amount of the localized band formation element in the p-type semiconductor is larger than an amount of the acceptor element in the p-type semiconductor,
   the acceptor element has a lower energy level than a top of an energy band of the localized band formation element,
   the acceptor element and the localized band formation element are distributed uniformly,
   an amount of the localized band formation element in the p-type semiconductor is 2 atom % or less,
   the p-type semiconductor is a compound semiconductor,
   the compound semiconductor is a nitride semiconductor, and
   the nitride semiconductor is a compound semiconductor which has at least one Group III element including boron and at least one Group V element including nitrogen.

2. A p-type semiconductor comprising a plurality of elements, one of the elements being a localized band formation element, the localized band formation element being isovalent with at least one other of the elements of the p-type semiconductor and having a smaller electronegativity than an electronegativity of the at least one other element, wherein
   another of the elements is an acceptor element, the acceptor element having fewer valence electrons than valence electrons of at least one other of the elements of the p-type semiconductor,
   an amount of the localized band formation element in the p-type semiconductor is larger than an amount of the acceptor element in the p-type semiconductor,
   the acceptor element has a lower energy level than a top of an energy band of the localized band formation element,
   the acceptor element and the localized band formation element are distributed uniformly,
   an amount of the localized band formation element in the p-type semiconductor is 2 atom % or less,
   the p-type semiconductor is a compound semiconductor, and
   the compound semiconductor is an oxide semiconductor.

3. The p-type semiconductor according to claim 2, wherein the oxide semiconductor is a compound semiconductor which has at least one Group II element including beryllium and at least one Group VI element including oxygen.

4. The p-type semiconductor according to claim 2, wherein the oxide semiconductor is a compound semiconductor which has at least one Group II element including zinc and at least one Group VI element including oxygen.

5. The p-type semiconductor according to claim 4, wherein the acceptor element is at least one of nitrogen, phosphorus, arsenic and antimony.

6. The p-type semiconductor according to claim 5, wherein the localized band formation element is at least one of sulfur, selenium and tellurium.

* * * * *

UNITED STATES PATENT AND TRADEMARK OFFICE
CERTIFICATE OF CORRECTION

| | | |
|---|---|---|
| PATENT NO. | : 7,786,550 B2 | Page 1 of 1 |
| APPLICATION NO. | : 10/790864 | |
| DATED | : August 31, 2010 | |
| INVENTOR(S) | : Toshiyuki Takizawa | |

It is certified that error appears in the above-identified patent and that said Letters Patent is hereby corrected as shown below:

On the Title Page
Item (75), Inventor, please change "Toshiyuki Takizawa, Osaka (JP)" to -- Toshiyuki Takizawa, Kyoto (JP) --.

Signed and Sealed this
Twenty-fifth Day of January, 2011

David J. Kappos
*Director of the United States Patent and Trademark Office*